United States Patent
Kono

(10) Patent No.: US 6,598,520 B2
(45) Date of Patent: *Jul. 29, 2003

(54) HOT PRESSING APPARATUS

(75) Inventor: Takayuki Kono, Ohbu (JP)

(73) Assignee: Kabushiki Kaisha Meiki Seisakusho, Aichi-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/920,650

(22) Filed: Aug. 3, 2001

(65) Prior Publication Data

US 2002/0020309 A1 Feb. 21, 2002

(30) Foreign Application Priority Data

Aug. 11, 2000 (JP) .......................... 2000-244241

(51) Int. Cl.$^7$ .............................................. B30B 15/34
(52) U.S. Cl. ....................... 100/325; 100/326; 100/194; 100/199; 156/583.1
(58) Field of Search ...................... 100/92, 194, 325, 100/326, 195, 315, 324, 199; 156/580, 583.1

(56) References Cited

U.S. PATENT DOCUMENTS 4,222,724 A * 9/1980 van Hullen .................. 100/195
4,857,135 A * 8/1989 Copp .......................... 100/194

\* cited by examiner

Primary Examiner—Allen Ostrager
Assistant Examiner—Shelley Self
(74) Attorney, Agent, or Firm—Nath & Associates PLLC; Gary M. Nath; Marvin C. Berkowitz

(57) ABSTRACT

In a hot pressing apparatus, a hot-plate pressing cylinder is provided at the center of a moving plate, and a substantially central part of each of the materials to be laminated between hot plates, which are pressed by a fixed plate and a moving plate, is pressed by a hot-plate pressing cylinder of the moving plate. Thus, a uniform pressure can be applied to the materials to be laminated, thereby preventing the occurrence of defects such as wrinkles and bubbles in the products.

4 Claims, 11 Drawing Sheets

HOT PRESSING APPARATUS

BACKGROUND OF THE INVENTION

1. Field of the Invention

The present invention relates to a hot pressing apparatus, and particularly, concerns a hot pressing apparatus for obtaining laminated products such as printed circuit boards, which require high accuracy.

2. Description of the Related Art

FIGS. 9 and 10 show a conventional pit-type hot pressing apparatus 71, in which materials 80 to be laminated are placed between a plurality of hot plates 76 disposed at a predetermined distance from each other in a chamber 73 on a base plate 72, a ram-operating cylinder 78 housed in a pit 77 under the base plate 72 is operated so that a ram 79 pushes up a moving plate 75 toward a fixed plate 74 and the moving plate 75 sequentially pushes up the hot plates 76, and thus the materials 80 to be laminated between the hot plates 76 are hot pressed to be integrally laminated. Although such a pit-type hot pressing apparatus 71 has high rigidity and can apply a uniform pressure to the materials 80 to be laminated, it is expensive and time consuming to construct the pit 77 and relocation of or additional installation to the apparatus is difficult.

Accordingly, as shown in FIG. 8, a so-called pitless hot pressing apparatus 81 has recently become common, in which a moving plate 85 is elevated by a plurality of moving-plate operating cylinders 87 each having a cylinder 87a formed on a fixed plate 84 thereof and a rod 87b fixed to the moving plate 85, so that hot plates 86 are sequentially elevated by the moving plate 85, and thus the materials 80 to be laminated between the hot plates 86 are hot pressed. In such a pitless hot pressing apparatus 81, since there is no need to make room under the moving plate 75, for the stroke length of the ram 79 for pressing the moving plate 75 to a predetermined height, compared with the pit-type hot pressing apparatus 71 (refer to FIGS. 9 and 10), the pit 77 can be omitted.

However, in the pitless hot pressing apparatus 81, since the moving plate 85 is elevated by the plurality of moving-plate operating cylinders 87 disposed on the fixed plate 84, the rod 87b of the moving-plate operating cylinders 87 needs to be fixed to the edge of the moving plate 85. Accordingly, when the materials 80 to be laminated are pressed by this pitless hot pressing apparatus 81, the center of the moving plate 85 and the fixed plate 84, between which the material 80 to be laminated is placed, is deformed to a concave shape and the material 80 to be laminated is likely to have a substantially curved shape in cross section, in which the center thereof bulges, as shown in FIG. 11. As a result, the material 80 to be laminated cannot be pressed with a uniformly distributed pressure by the moving plate 85 and the fixed plate 84, so that wrinkles or bubbles generate on the material 80 to be laminated, thus causing defects in the products. Also, variation in the force by which the plurality of moving-plate operating cylinders 87 elevates the moving plate 85 may occur due to the difference in packing of the moving-plate operating cylinders 87, so that the materials 80 to be laminated cannot be pressed with a uniformly distributed pressure, resulting in defects in the products.

Therefore, a pitless hot pressing apparatus is required, in which the materials 80 to be laminated are uniformly pressed so that generation of wrinkles or bubbles in the products is prevented.

SUMMARY OF THE INVENTION

The present invention is made in consideration of the above problems. Accordingly, it is an object of the present invention to provide a pitless hot pressing apparatus in which materials to be laminated are uniformly pressed so that generation of wrinkles or bubbles in products is prevented.

In order to achieve the above object, according to a first aspect of the present invention, a hot pressing apparatus comprises: a plurality of hot plates in a chamber; a moving plate; a fixed plate; a plurality of shaft members; a moving-plate operating device; and a hot-plate pressing device, wherein materials to be laminated are disposed between the plurality of hot plates and the moving plate is moved toward the fixed plate, so that the materials to be laminated between the hot plates are hot pressed and integrally laminated, wherein the periphery of the moving plate is supported by the plurality of shaft members, wherein the moving plate is moved toward the fixed plate by the moving-plate operating device, and wherein a substantially central part of each hot plate is pressed by the hot-plate pressing device provided at the center of the moving plate.

By such a configuration, the moving plate is moved toward the fixed plate by the moving-plate operating device, so that the materials to be laminated between the hot plates can be pressed by the moving plate and the fixed plate. Also the substantially central part of each hot plate between which the materials to be laminated are placed can be pressed by the hot-plate pressing device.

In the hot pressing apparatus, preferably, the fixed plate is provided with a moving-plate retaining device for locking the shaft members and retaining the moving plate in position, by which the moving plate is retained when the hot-plate pressing device presses the materials to be laminated.

By such a configuration, the shaft members can be locked by the moving-plate retaining device mounted on the fixed plate, so that the moving plate can be mechanically retained when the materials to be laminated are pressed by the hot-plate pressing device.

In the hot pressing apparatus, preferably, the moving plate is guided by a plurality of guide bars disposed in the chamber.

By such a configuration, the moving plate is guided by the plurality of guide bars, so that the moving plate can be smoothly moved.

According to a second aspect of the present invention, a hot pressing apparatus comprises: a plurality of hot plates in a chamber; a moving plate; a fixed plate; a plurality of shaft members for supporting the periphery of the moving plate; a moving-plate operating device for moving the moving plate toward the fixed plate; a plurality of guide bars disposed in the chamber and for guiding the movement of the moving plate; a hot-plate pressing device provided at the center of the moving plate and for pressing a substantially central part of each hot plate; and a moving-plate retaining device provided on the moving plate and locking the guide bars to retain the moving plate in position, wherein materials to be laminated are disposed between the plurality of hot plates and the moving plate is moved toward the fixed plate, so that the materials to be laminated between the hot plates are hot pressed and integrally laminated, and wherein the moving plate is retained by the moving plate retaining device when the hot plates are pressed by the hot-plate pressing device.

By such a configuration, the moving plate is moved toward the fixed plate by the moving-plate operating device, so that the materials to be laminated between the hot plates can be pressed by the moving plate and the fixed plate. Also, the moving plate is guided by the plurality of guide bars; therefore, the moving plate can be smoothly moved. The guide bars are locked by the moving-plate retaining device provided on the moving plate, so that the moving plate can be mechanically retained and the substantially central part of each hot plate, which is pressed by the moving plate and the fixed plate, can be pressed by the hot-plate pressing device in a state in which the moving plate is firmly retained.

In the hot pressing apparatus, preferably, each shaft member is provided with a guide hole such that each shaft member axially passes through each guide hole. The guide bars are coaxially provided in each shaft member and are slid into each guide hole.

By such a configuration, when the moving-plate operating device is, for example, a hydraulic cylinder or the like, a guide hole is provided in the rod of each cylinder, into which the guide bar is slid, so that each rod is guided by the guide bars so as to be smoothly moved, thus enabling the moving plate to be smoothly moved.

DESCRIPTION OF THE PREFERRED EMBODIMENTS

Figure 1:
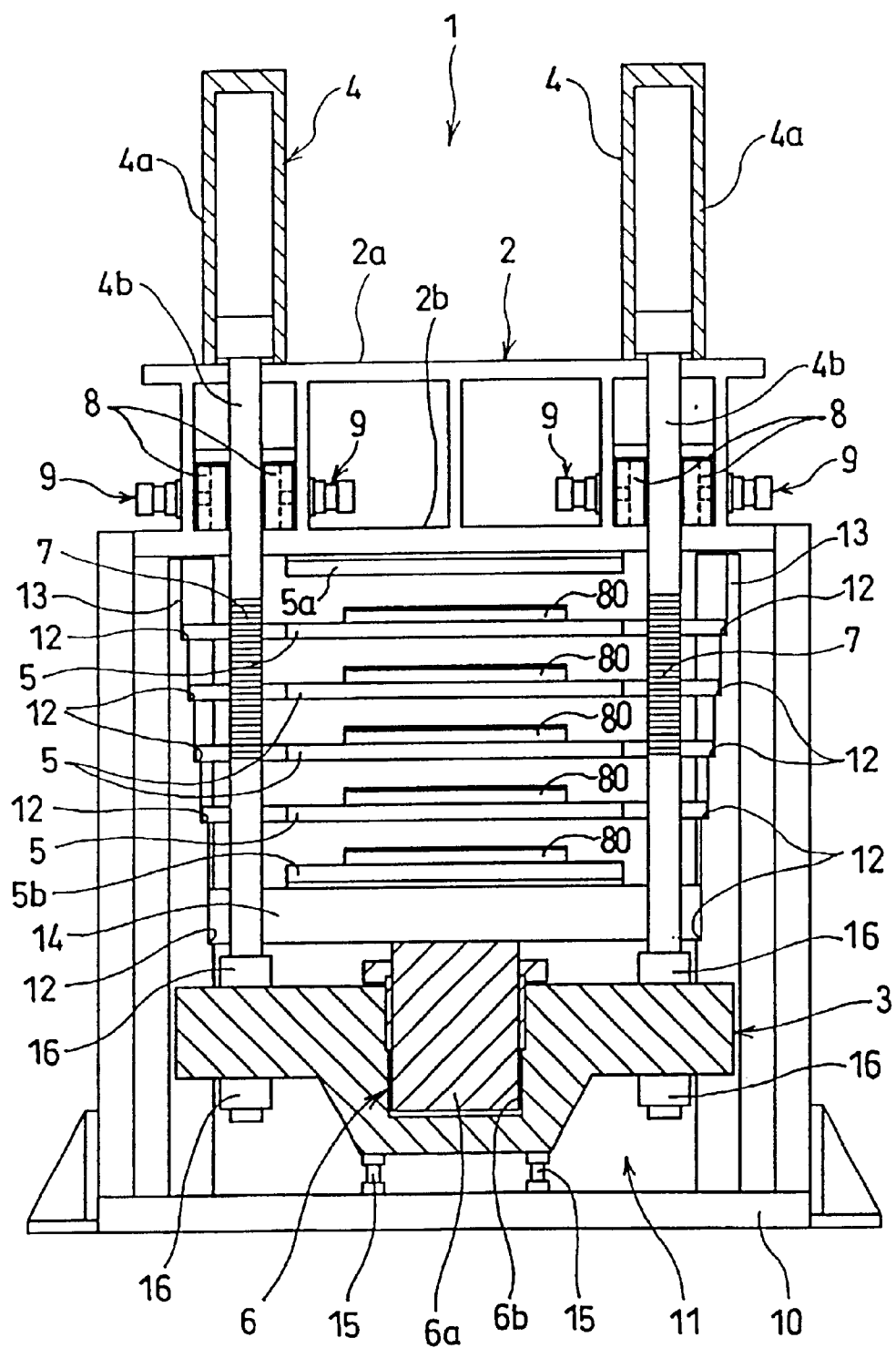
FIG. 1 is an explanatory view of a hot pressing apparatus according to a first embodiment of the present invention, specifically showing a state in which the press is opened.
Figure 2:
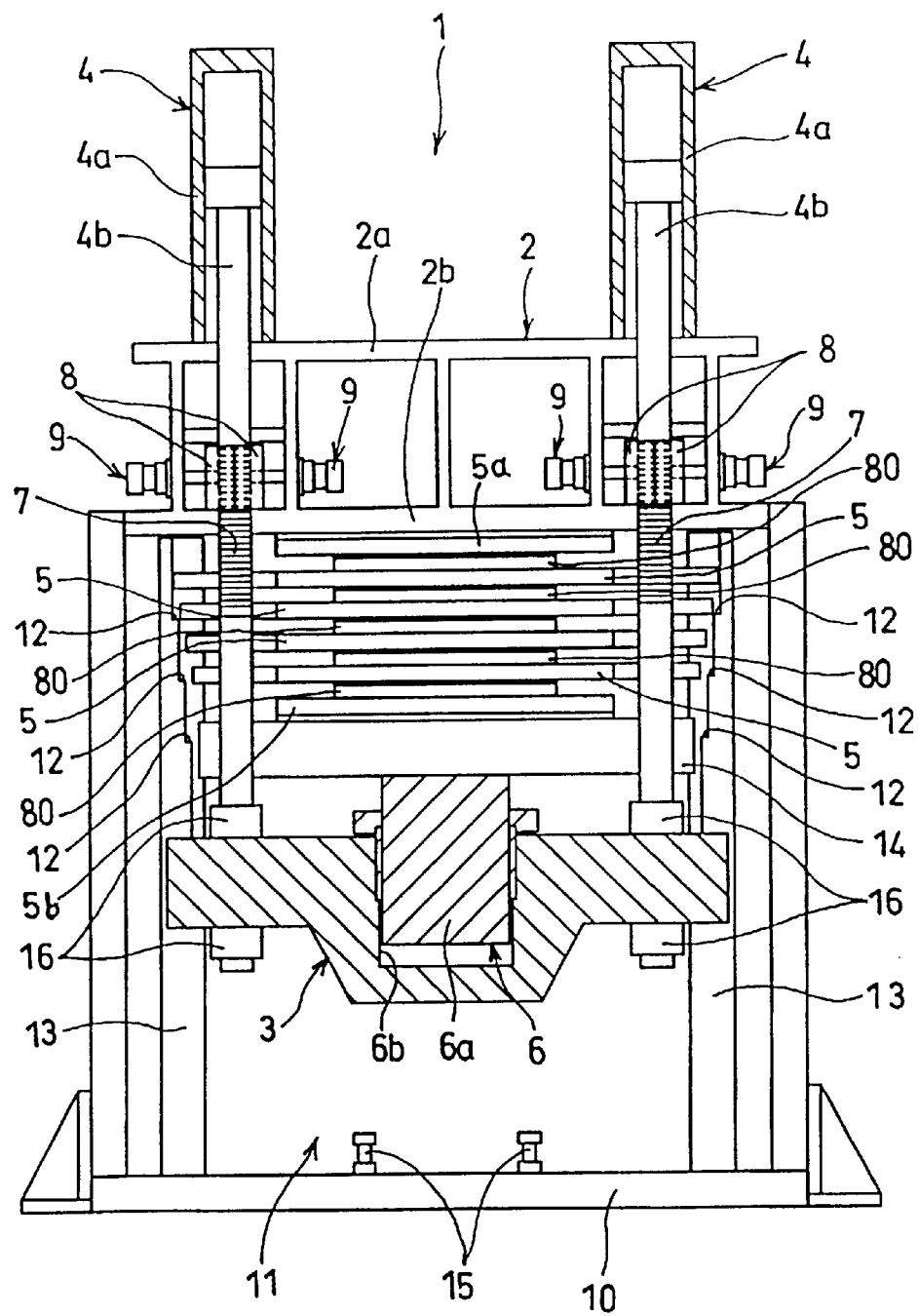
FIG. 2 is a an explanatory view of the hot pressing apparatus according to the first embodiment of the present invention, specifically showing a state in which the press is closed.

Referring to FIGS. 1 and 2, a hot pressing apparatus according to a first embodiment of the present invention will be described. First, the outline of a hot pressing apparatus 1 according to the first embodiment will be described hereinbelow. As shown in FIGS. 1 and 2, the hot pressing apparatus 1 according to the first embodiment is a so-called pitless hot pressing apparatus in which a moving plate 3 is elevated toward a fixed plate 2 by a plurality of moving-plate operating cylinders 4 disposed on the fixed plate 2. A substantially central part of each material 80 to be laminated between hot plates 5, which is pressed by the fixed plate 2 and the moving plate 3, is pressed by a hot-plate pressing cylinder 6 which is disposed at the center of the moving plate 3, and the pressure is uniformly applied to the materials 80 to be laminated, thereby preventing the occurrence of defects in the products, such as wrinkles and bubbles. In the hot pressing apparatus 1 according to the first embodiment, there is provided a plurality of moving-plate operating cylinders 4 (4 sets of said cylinders are provided in the first embodiment), wherein one of which has a locking section 7 formed on each rod 4b thereof, and lock cylinder units 9 provided on the fixed plate to retain the moving plate 3, each unit having a locking member 8 which can be engaged with the corresponding locking section 7. The lock cylinder units 9 are operated under predetermined conditions to engage the locking members 8 with the locking section 7, thereby locking the operation of each rod 4b and retaining the moving plate 3. Accordingly, the moving plate 3 can be mechanically retained when the hot plates 5 are pressed by the hot-plate pressing cylinder 6 by operating the lock cylinder units 9 in a state in which the materials 80 to be laminated between the hot plates 5 are pressed by the fixed plate 2 and the moving plate 3. Thus, the pressure from the hot-plate pressing cylinder 6 can be uniformly applied to the materials 80 to be laminated.

Next, the hot pressing apparatus 1 according to the first embodiment will be specifically described. As shown in FIGS. 1 and 2, a chamber 11 is formed between a base plate 10 and the fixed plate 2 to integrally laminate the materials 80 to be laminated. On both sides of the chamber 11, a plurality of set plates 13 each having a plurality of steps 12 formed at a predetermined distance from each other is vertically arranged. The hot plates 5 are supported by the steps 12 formed on the plurality of set plates 13, and thus the plurality of hot plates 5 is disposed at a predetermined distance from each other in the chamber 11, so that the materials 80 to be laminated are placed between the hot plates 5. An uppermost hot plate 5a is disposed on the bottom of the fixed plate 2 and a lowermost hot plate 5b is disposed on a lower plate 14. The chamber 11 may be maintained either under a vacuum or under no vacuum.

As shown in FIGS. 1 and 2, the fixed plate 2 is constructed in such a manner that an upper plate 2a and an under plate 2b are arranged in parallel, wherein cylinders 4a of the plurality of moving-plate operating cylinders 4 are disposed on the upper plate 2a. Each of the moving-plate operating cylinders 4 is constructed in such a manner that each rod 4b passes through the fixed plate 2 and is fixed to the moving plate 3, and the moving plate 3 is positioned in such a way that the plurality of hot plates 5 and the lower plate 14 are interposed between the moving plate 3 and the fixed plate 2. Each rod 4b has the locking section 7 formed on the peripheral surface thereof, which has a plurality of grooves around the central axis of each rod 4b. The fixed plate 2 has the pair of lock cylinder units 9 each having the locking member 8 in a freely movable manner in such a way that they sandwich each rod 4b. The lock cylinder units 9 are operated to engage the pair of locking members 8 with the locking section 7 of each rod 4b, and thus the operation of each rod 4b is locked to mechanically retain the moving plate 3. The moving-plate retaining device includes the locking section 7, the pair of locking members 8 and the lock cylinder units 9.

The structure of the moving-plate retaining device in the hot pressing apparatus 1 according to the first embodiment is not limited to the structure in which the locking members 8 are engaged with the locking section 7 by operating the lock cylinder units 9. It is sufficient that the moving plate 3 is firmly retained when the materials 80 to be laminated between the hot plates 5 are pressed by the hot-plate pressing cylinder 6. For example, it is possible to firmly fasten a peripheral housing on the fixed plate 2, the housing having an insertion hole, into which each rod 4b of the moving-plate operating cylinders 4 is inserted, and to dispose a tube having an oval hollow shape in cross section in such a manner that its short axis is in a direction in which an inner peripheral surface of the insertion hole of the peripheral housing and an outer peripheral surface of each rod 4b face each other. The tube is then deformed by applying pressure into the tube, so that the peripheral surface of the tube is pressed into contact with the inner peripheral surface of the insertion hole of the peripheral housing and the outer peripheral surface of each rod 4b, so that the relative movement of the peripheral housing and each rod 4b is stopped, and thus the moving plate 3 can be firmly retained.

As shown in FIGS. 1 and 2, the moving plate 3 is provided with the hot-plate pressing cylinder 6 having a ram 6a and a ram cylinder 6b at the center thereof. In the hot-plate pressing cylinder 6, the ram 6a is operated by hydraulic operating oil fed from a hydraulic unit (not shown). As shown in FIG. 2, in the hot pressing apparatus 1 according to the first embodiment, the moving plate 3, which is elevated by the moving-plate operating cylinders 4, is retained in such a way that the operation of each rod 4b with respect to the fixed plate 2 is locked by operating the lock cylinder units 9 according to predetermined conditions (turning-ON or the like of a cylinder switch disposed on the moving-plate operating cylinders 4) and by engaging the locking members 8 with the locking section 7. Thus, the moving plate 3 is mechanically retained in a state in which the materials 80 to be laminated between the hot plates 5 are pressed. In such a state in which the moving plate 3 is firmly retained, the hot-plate pressing cylinder 6 is operated so that the ram 6a presses the center of the lower plate 14, and thus, a uniform pressure is applied to the materials 80 to be laminated. In addition, the pressing face of the hot-plate pressing cylinder 6 is formed in such a way as to press the entire surface or almost the entire surface of each material 80 to be laminated, which is disposed on the hot plate 5. Accordingly, the pressure of the hot-plate pressing cylinder 6 is applied to the entire surface of each material 80 to be laminated, and thus, improved surface smoothness of the materials 80 to be laminated can be obtained, thus being best suited for manufacturing printed circuit boards or the like. Reference numeral 15 shown in FIGS. 1 and 2 denotes a stopper at the lowermost end of the moving plate 3. Reference numeral 16 indicates a lock nut for fastening each rod 4b of the moving-plate operating cylinders 4 to the moving plate 3.

Figure 7:
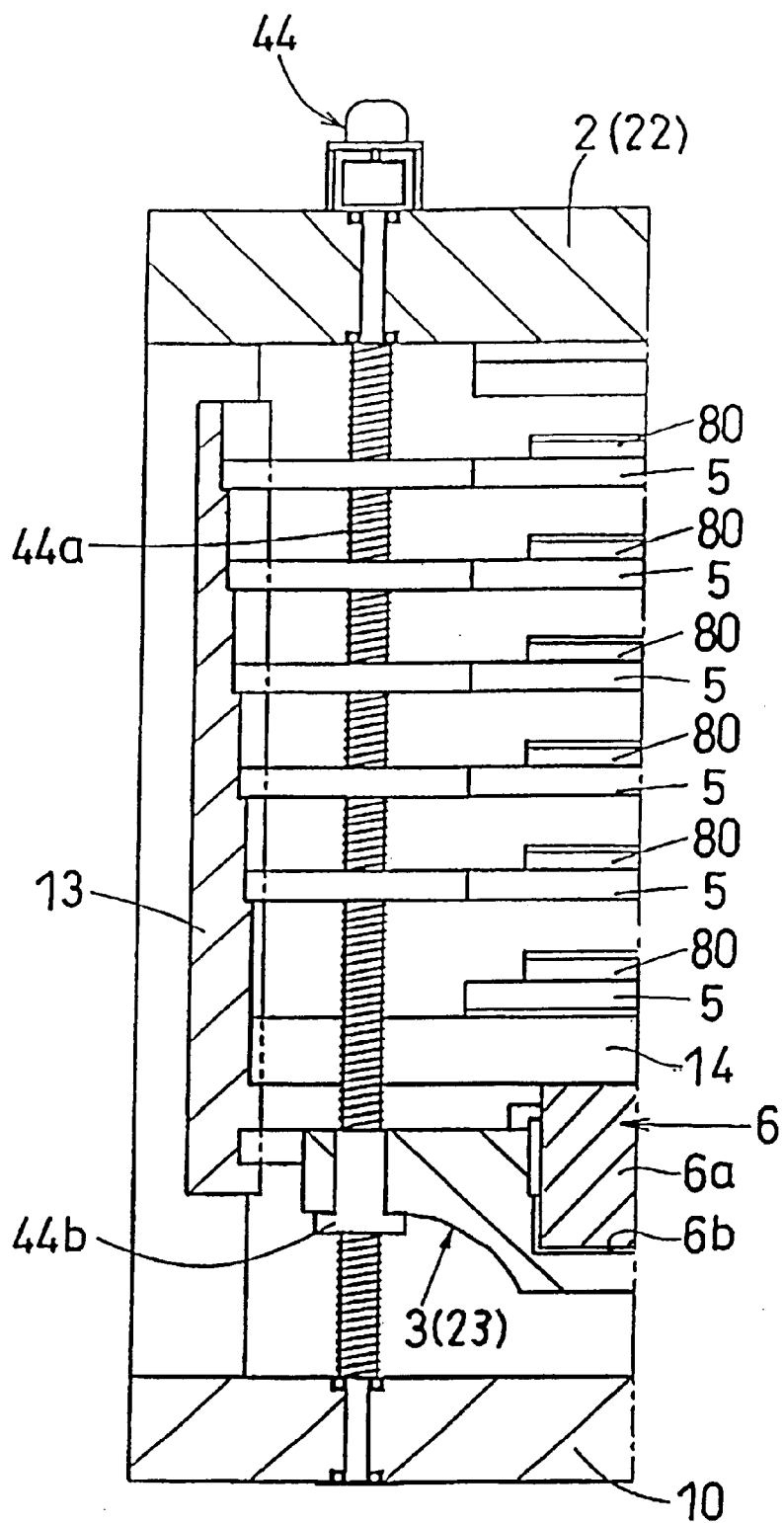
FIG. 7 is a view showing an embodiment when an electric motor is used as a moving-plate operating device.
Figure 8:
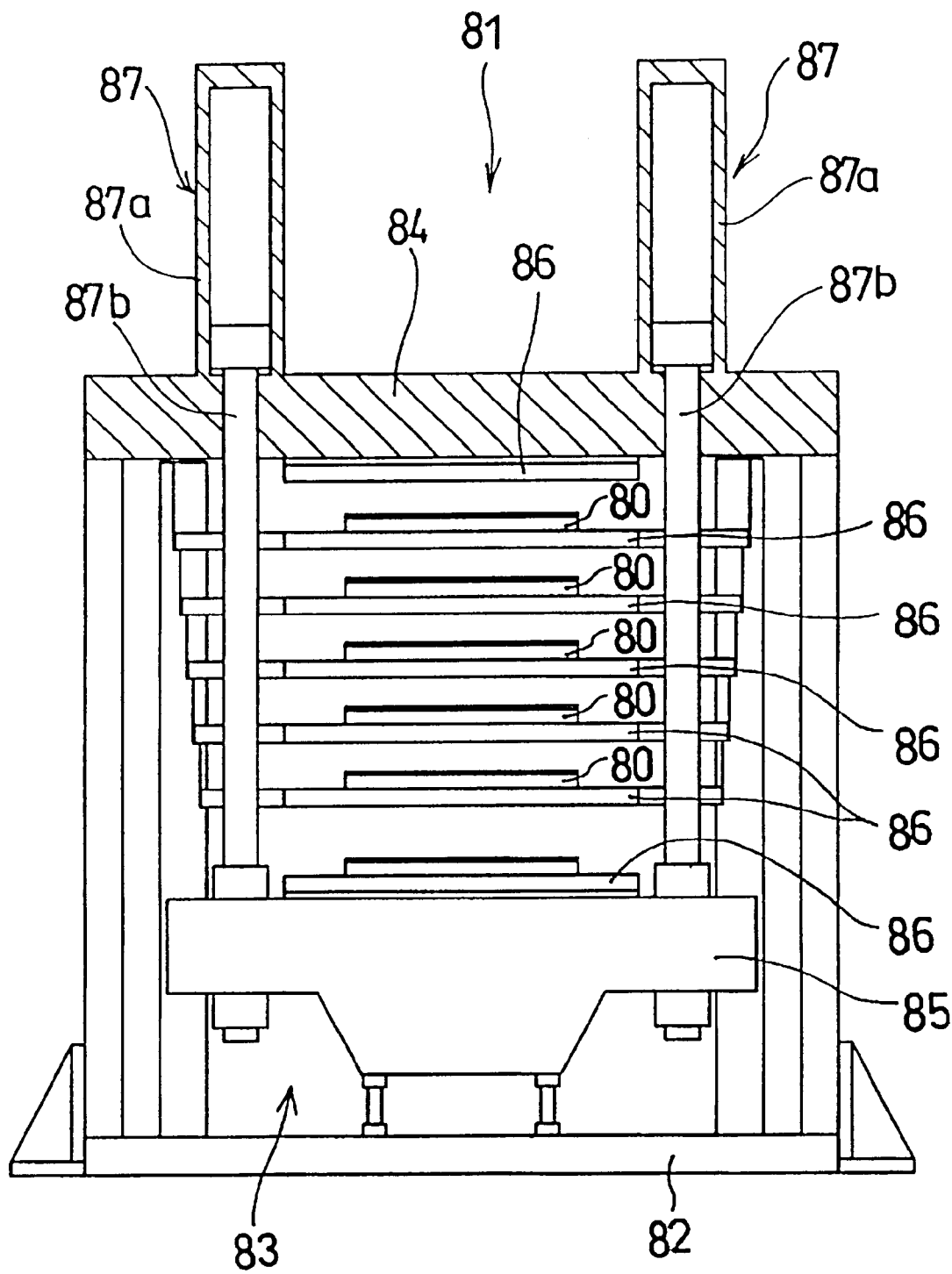
FIG. 8 is an explanatory view of a conventional pitless hot pressing apparatus, specifically showing a state in which the press is opened.
Figure 9:
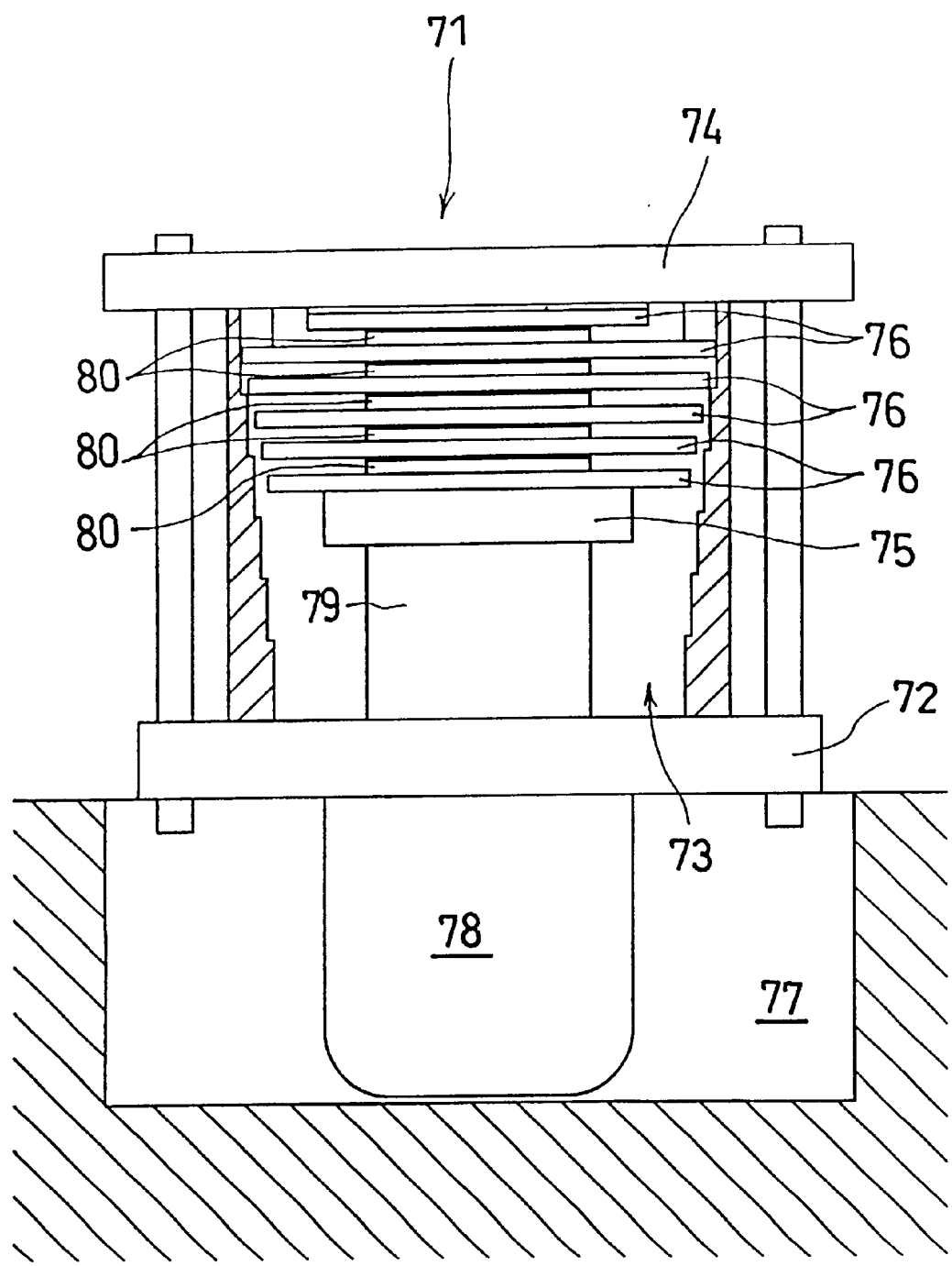
FIG. 9 is an explanatory view of a conventional pit-type hot pressing apparatus, specifically showing a state in which the press is closed.
Figure 10:
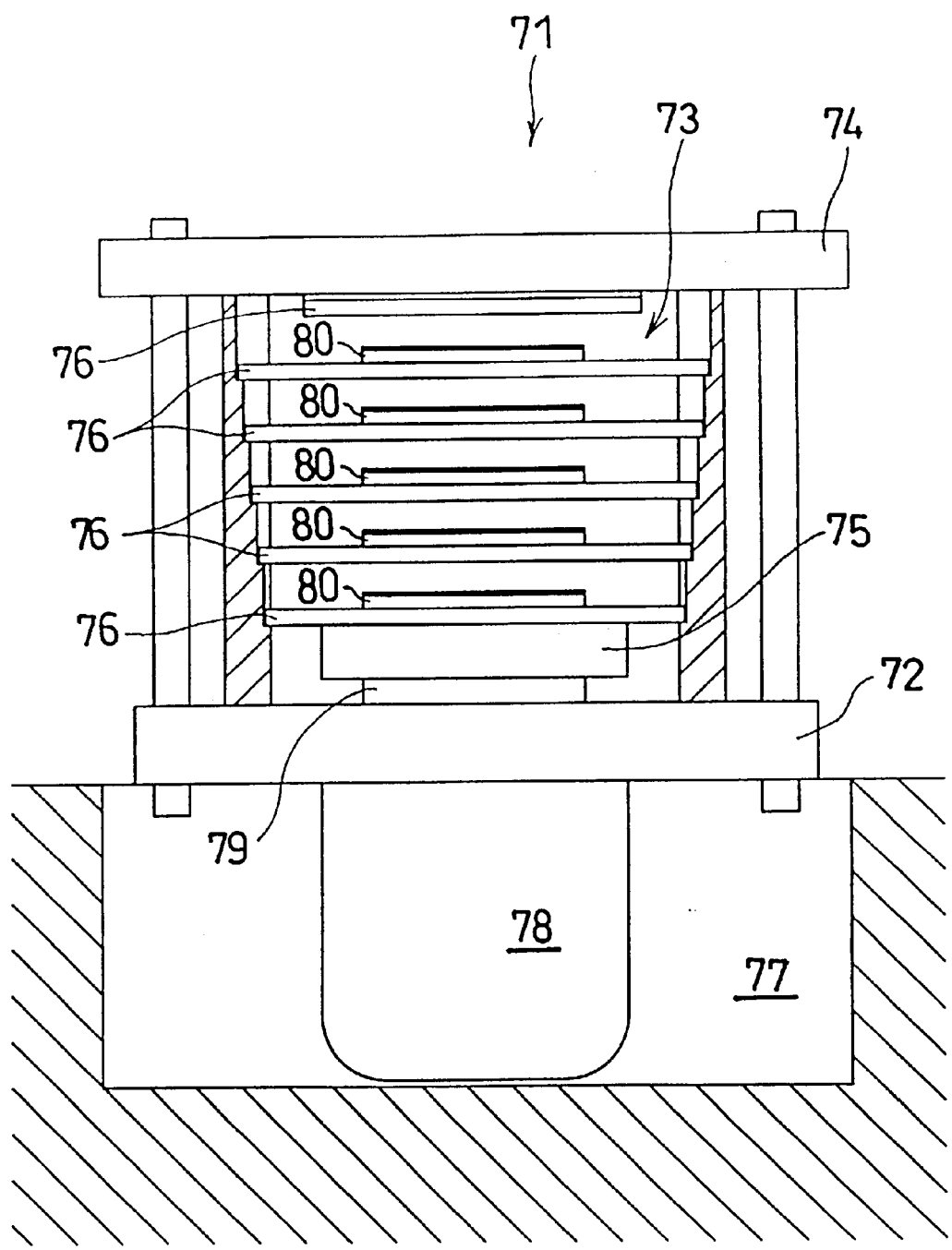
FIG. 10 is an explanatory view of the conventional pit-type hot pressing apparatus, specifically showing a state in which the press is opened.
Figure 11:
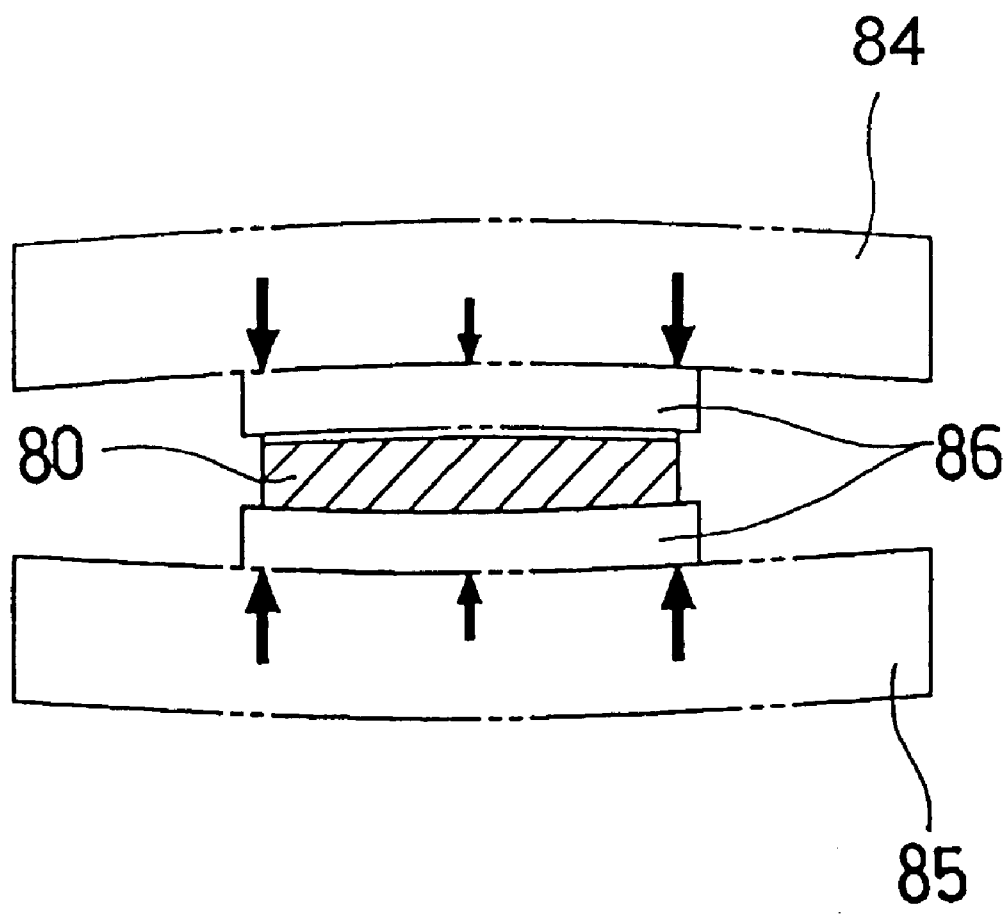
FIG. 11 is a schematic view showing a state in which a material to be laminated is pressed in the conventional pitless hot pressing apparatus.

The moving-plate operating device in the hot pressing apparatus 1 according to the first embodiment is not limited to a cylinder unit having a movable rod. As shown in FIG. 7, for example, it is possible to fix a nut 44b in position at the outer periphery of the moving plate 3, and to operate a screw member 44a which is screwed on the nut 44b by a servomotor 44 disposed on the fixed plate 2, thereby moving the moving plate 3 in an axial direction of the screw member 44a.

By such a configuration, the operation of the hot pressing apparatus 1 according to the first embodiment will be described hereinbelow. First, from the state shown in FIG. 1, in which the moving plate 3 is positioned at the lowermost end, the plurality of hot plates 5 held on the plurality of set plates 13 is sequentially pressed up toward the fixed plate 2 by the moving plate 3 by operating the moving-plate operating cylinders 4. Next, as shown in FIG. 2, the lock cylinder units 9 are operated to engage the pair of locking members 8 with the locking section 7 of each rod 4b in a state in which the materials 80 to be laminated between the hot plates 5 are pressed by the fixed plate 2 and the moving plate 3, and thus the operation of each rod 4b of the moving-plate operating cylinders 4 is locked to mechanically retain the moving plate 3. Subsequently, in such a state in which the moving plate 3 is retained, the hot-plate pressing cylinder 6 is operated so that the ram 6a presses the center of the lower plate 14, and thus almost the entire surface of each material 80 to be laminated is pressed.

Accordingly, in the hot pressing apparatus 1 according to the first embodiment, the hot-plate pressing cylinder 6 is provided at the center of the moving plate 3, and almost the entire surface of each material 80 to be laminated between the hot plates 5 is pressed by the fixed plate 2 and the moving plate 3 with the hot-plate pressing cylinder 6, so that a uniform pressure can be applied to the materials 80 to be laminated, thereby preventing the occurrence of defects, such as wrinkles and bubbles, in the products (printed-circuit boards or the like).

In the hot pressing apparatus 1 according to the first embodiment, the locking section 7 is formed on each rod 4b, and the fixed plate 2 is provided with the lock cylinder units 9 each having the locking members 8 which can be engaged with the locking section 7 in a freely movable manner. The lock cylinder units 9 are operated to engage the locking members 8 with the locking section 7, thereby locking the operation of each rod 4b and mechanically retaining the moving plate 3 when the hot-plate pressing cylinder 6 presses the materials 80 to be laminated between the hot plates 5. Accordingly, the pressure by the hot-plate pressing cylinder 6 can be efficiently applied to the materials 80 to be laminated. Also, a reactive force against the pressure is not exerted to the moving-plate operating cylinders 4, and thus the hydraulic cylinder as the moving-plate operating cylinder 4 results in capacity savings, in other words, it can be miniaturized, thereby decreasing the size of the entire hydraulic unit.

Figure 3:
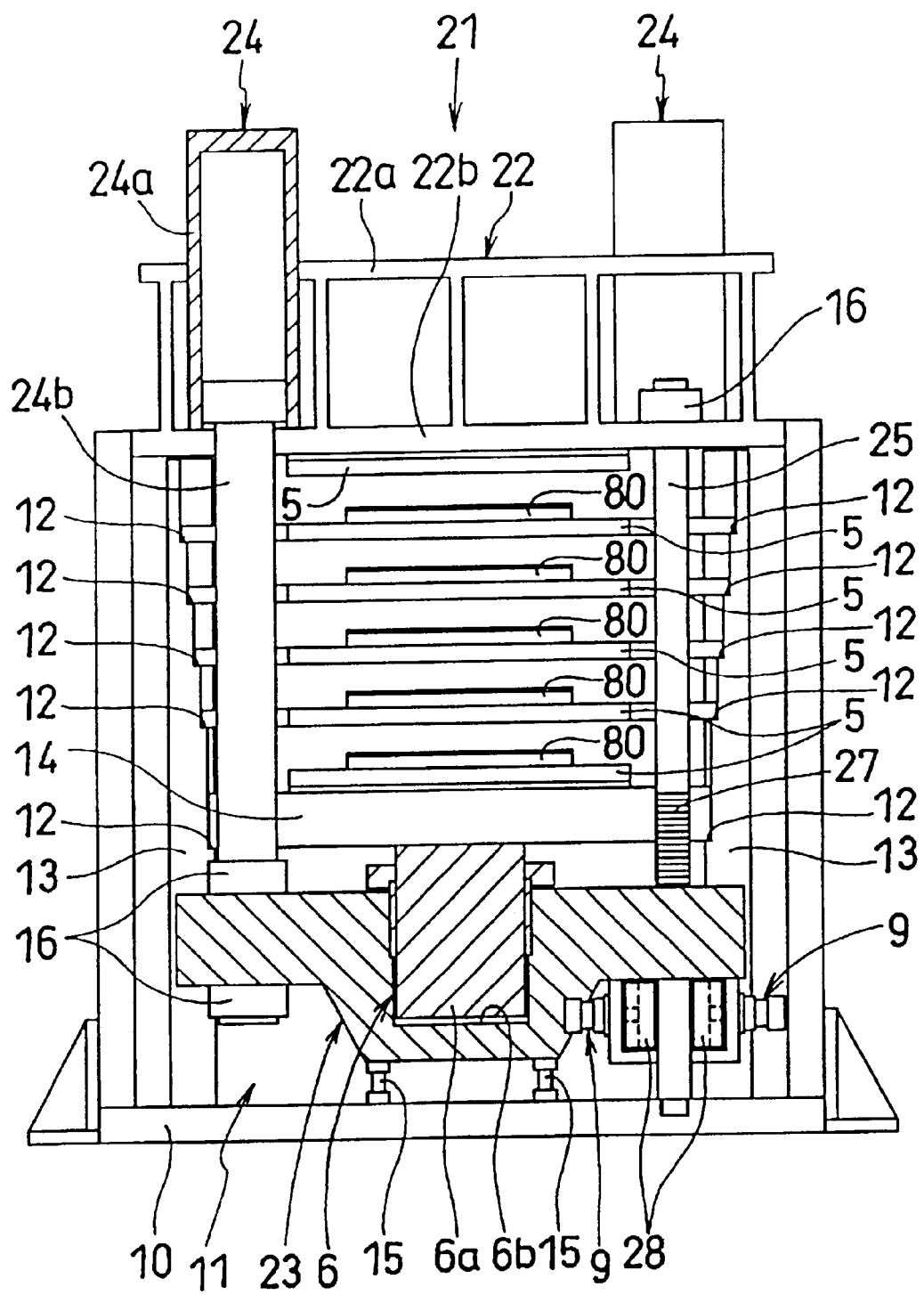
FIG. 3 is an explanatory view of a hot pressing apparatus according to a second embodiment of the present invention, specifically showing a state in which the press is opened.
Figure 4:
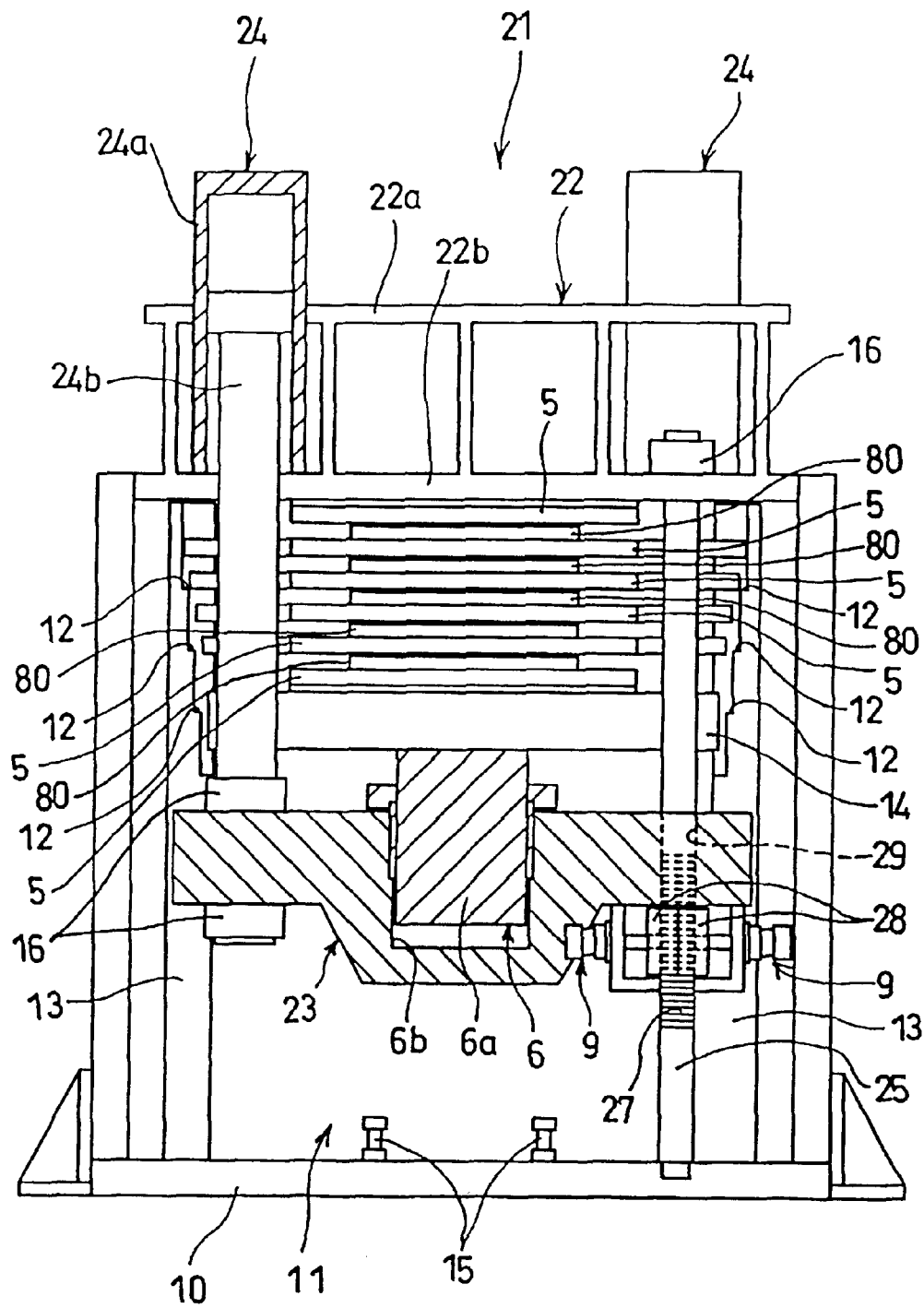
FIG. 4 is a an explanatory view of the hot pressing apparatus according to the second embodiment of the present invention, specifically showing a state in which the press is closed.

A hot pressing apparatus according to a second embodiment of the present invention will be described hereinbelow with reference to FIGS. 3 and 4. Elements having the same structure as those of the hot pressing apparatus 1 according to the first embodiment are denoted by the same name and the same reference numerals, and a description thereof is omitted. First, the outline of a hot pressing apparatus 21 according to the second embodiment will be described. As shown in FIGS. 3 and 4, in the hot pressing apparatus 21 according to the second embodiment, a plurality of guide bars 25 (4 sets of said bars are disposed in the second embodiment) disposed in the chamber 11 guides a moving plate 23 so that the moving plate 23 can be smoothly moved. Also, in the hot pressing apparatus 21 according to the second embodiment, a locking section 27 is formed on each of the plurality of guide bars 25, and the moving plate 23 is provided with the lock cylinder units 9 each having a locking member 28 which can be engaged with the locking section 27. The moving plate 23 is locked to the guide bars 25 by operating the lock cylinder units 9 to engage the locking members 28 with the locking section 27, thereby mechanically retaining the moving plate 23 when the hot-plate pressing cylinder 6 presses the hot plates 5.

Next, the hot pressing apparatus 21 according to the second embodiment will be specifically described. As shown in FIGS. 3 and 4, a fixed plate 22 is constructed in such a manner that an upper plate 22a and an under plate 22b are arranged in parallel to each other, wherein cylinders 24a of a plurality of moving-plate operating cylinders 24 (not shown, 4 sets in the second embodiment) are disposed on the fixed plate 22. Each of the moving-plate operating cylinders 24 is constructed in such a manner that a rod 24b passes through the fixed plate 22 and is fixed to the moving plate 23, and the moving plate 23 is positioned in such a way that the plurality of hot plates 5 and the lower plate 14 are interposed between the moving plate 23 and the fixed plate 22. In the chamber 11, the plurality of guide bars 25, in which one end thereof is fixed to the base plate 10 and the other end is fixed to the fixed plate 22, is installed. Each of the guide bars 25 is slid into an axial hole 29 (refer to FIG. 4) formed in the moving plate 23 and by which the moving plate 23 is guided. Also, a bush (not shown) serving as a sliding member is fixed to the axial hole 29 of the moving plate 23 and guides the moving plate 23 smoothly.

The moving-plate retaining device in the hot pressing apparatus 21 according to the second embodiment conforms to the moving-plate retaining device in the first embodiment, wherein the structure is not limited to the structure in which the locking members 28 are engaged with the locking section 27 by operating the lock cylinder units 9.

The locking sections 27 each having a plurality of grooves around the central axis are formed on the peripheral surface of each of the guide bars 25. The moving plate 23 is provided with a pair of the lock cylinder units 9 each having the movable locking member 28 in a freely movable manner in such a way that they sandwich each of the guide bars 25. By operating the lock cylinder units 9 according to predetermined conditions (turning-ON or the like of a cylinder switch mounted on the moving-plate operating cylinders 24), the pair of locking members 28 is engaged with the locking section 27 of each of the guide bars 25. Thus, the relative movement of the moving plate 23 and the guide bars 25 is controlled and the moving plate 23 is mechanically retained. In such a state in which the moving plate 23 is firmly retained, the center of the lower plate 14 is pressed by the ram 6a of the hot-plate pressing cylinder 6.

The moving-plate operating device in the hot pressing apparatus 21 according to the second embodiment conforms to the moving-plate operating device in the first embodiment, and is not limited to the cylinder unit.

In such an arrangement, the operation of the hot pressing apparatus 21 according to the second embodiment will be described hereinbelow. First, from the state shown in FIG. 3, in which the moving plate 23 is located at the lowermost end, the plurality of hot plates 5 held on the set plate 13 is sequentially pressed up toward the fixed plate 22 with the moving plate 23 by operating the plurality of moving-plate operating cylinders 24. In this instance, the moving plate 23 is guided by the plurality of guide bars 25, and thus, smooth elevation (movement) can be achieved. As shown in FIG. 4, the lock cylinder units 9 are operated to engage the pair of locking members 28 with the locking section 27 of each guide bar 25 in a state in which the materials 80 to be laminated between the hot plates 5 are pressed by the fixed plate 22 and the moving plate 23, and thus, the moving plate 23 is locked and mechanically held to the guide bars 25. Subsequently, in a state in which the moving plate 23 is firmly retained, the hot-plate pressing cylinder 6 is operated so that the ram 6a presses the center of the lower plate 14, and thus, almost the entire surface of each material 80 to be laminated is pressed.

Consequently, in the hot pressing apparatus 21 according to the second embodiment, the hot-plate pressing cylinder 6 is provided at the center of the moving plate 23, and almost the entire surface of each material 80 to be laminated between the hot plates 5, which is pressed by the fixed plate 22 and the moving plate 23, is pressed by the hot-plate pressing cylinder 6, so that a uniform pressure can be applied to the materials 80 to be laminated, thereby preventing the occurrence of defects, such as wrinkles and bubbles, in the products (printed-circuit boards or the like).

Also, in the hot pressing apparatus 21 according to the second embodiment, the moving plate 23 is guided by the plurality of guide bars 25, so that the moving plate 23 can be smoothly elevated (moved). Also, the locking section 27 is formed on each guide bar 25, and the moving plate 23 is provided with the lock cylinder units 9 each having the movable locking members 28 which can be engaged with the locking section 27 in a freely movable manner. By operating the lock cylinder units 9 to engage the locking members 28 with the locking section 27, the moving plate 23 is locked to the guide bars 25. The moving plate 23 is mechanically retained when the hot-plate pressing cylinder 6 presses the materials 80 to be laminated between the hot plates 5, so that the pressure from the hot-plate pressing cylinder 6 can be efficiently applied to the materials 80 to be laminated. Also, a reactive force against the pressure is not exerted to the moving-plate operating cylinder 24, and thus the hydraulic cylinder serving as the moving-plate operating cylinder 24 results in capacity savings, in other words, it can be miniaturized, thereby decreasing the size of the entire hydraulic unit. Also, as shown in FIGS. 3 and 4, in the hot pressing apparatus 21 according to the second embodiment, since the lock cylinder units 9 are formed on the moving plate 23, there is no need to extend each rod 4b in order to mount the lock cylinder units 9 compared with the hot pressing apparatus 1 according to the first embodiment (refer to FIGS. 1 and 2), and thus the height of the apparatus can be decreased, making it more compact.

Figure 5:
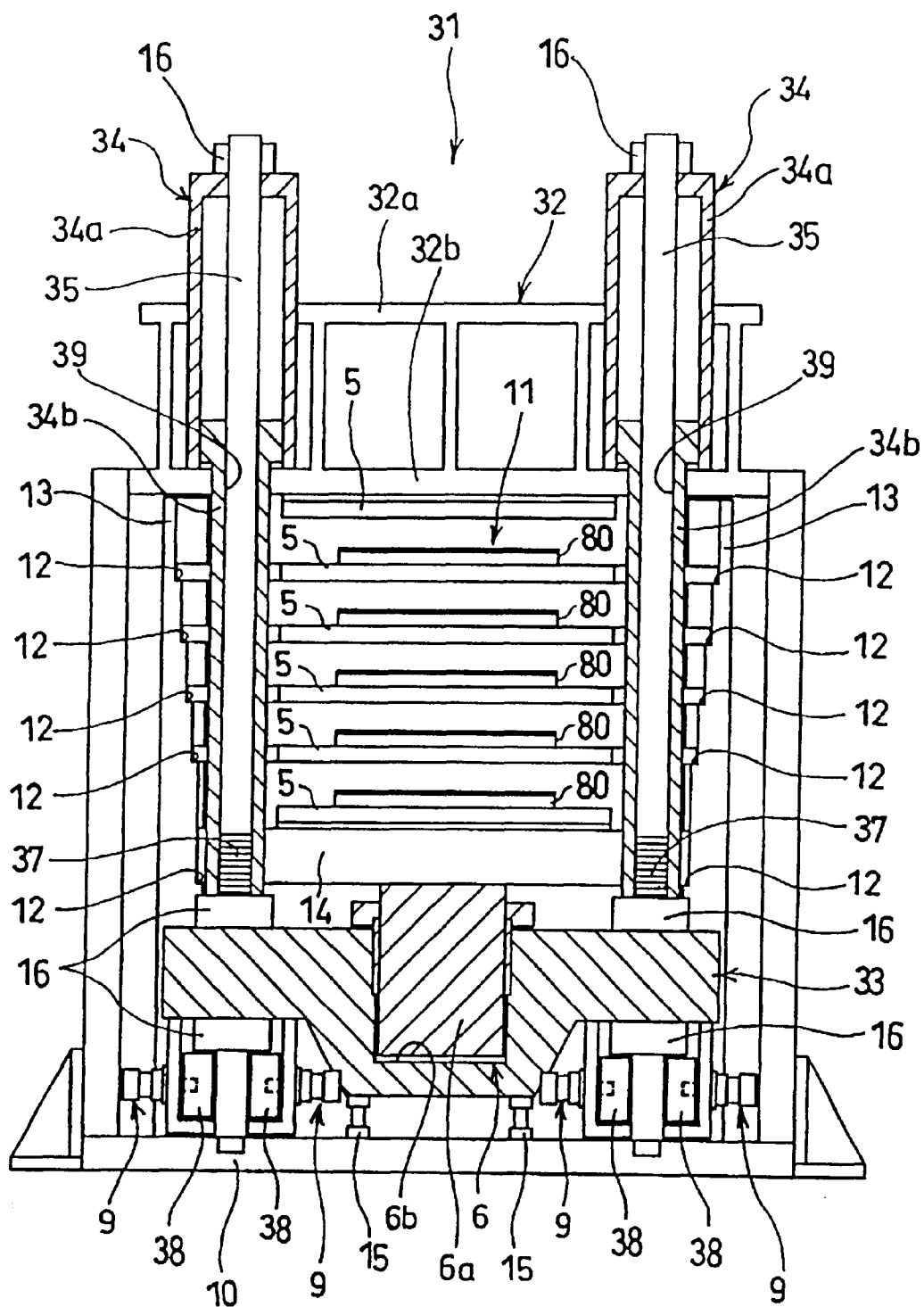
FIG. 5 is an explanatory view of a hot pressing apparatus according to a third embodiment of the present invention, specifically showing a state in which the press is opened.
Figure 6:
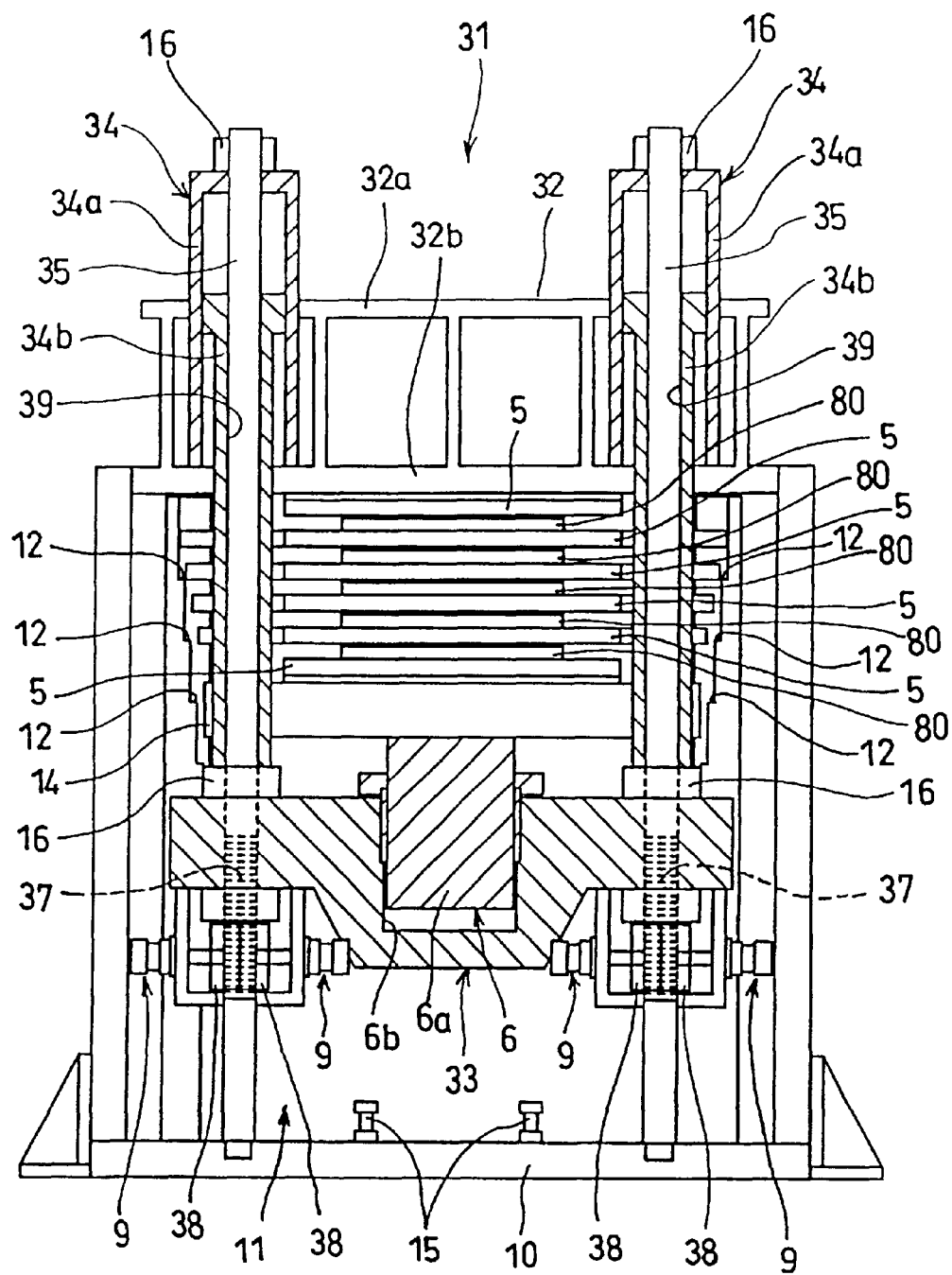
FIG. 6 is an explanatory view of the hot pressing apparatus according to the third embodiment of the present invention, specifically showing a state in which the press is closed.

A hot pressing apparatus according to a third embodiment of the present invention will be described hereinbelow with reference to FIGS. 5 and 6. Elements having the same structure as those of the hot pressing apparatus 1 according to the first embodiment and the hot pressing apparatus 21 according to the second embodiment are denoted by the same names and the same reference numerals, and a description thereof is omitted. First, the outline of a hot pressing apparatus 31 according to the third embodiment will be described. In the hot pressing apparatus 31 according to the third embodiment, a plurality of guide bars 35 is coaxially mounted on moving-plate operating cylinders 34; a rod 34b of each moving-plate operating cylinder 34 is provided with a guide hole 39 that axially passes therethrough; each guide hole 39 is formed around the guide bars 35 such that the guide bar 35 can be slid through the guide hole 39; each rod 34b is guided by the guide bars 35; and thus, the moving plate 33 can be moved smoothly. Also, in the hot pressing apparatus 31 according to the third embodiment, locking sections 37 are formed on the guide bars 35, the lock cylinder units 9 each having a locking member 38 that can be engaged with the corresponding locking section 37 are mounted on the moving plate 33, and the locking members 38 are engaged with the locking section 37 by operating the lock cylinder units 9 so that the moving plate 33 is locked to the guide bars 35, thereby mechanically retaining the moving plate 33 when the hot-plate pressing cylinder 6 presses the hot plates 5.

The hot pressing apparatus 31 according to the third embodiment will be specifically described hereinbelow. As shown in FIGS. 5 and 6, a fixed plate 32 is constructed in such a manner that an upper plate 32a and an under plate 32b are arranged in parallel to each other, wherein cylinders 34a of the plurality of moving-plate operating cylinders 34 (not shown, 4 sets in the third embodiment) are disposed on the fixed plate 32. Each of the moving-plate operating cylinders 34 is constructed in such a manner that each rod 34b passes through the fixed plate 32 and is fixed to the moving plate 33, and the moving plate 33 is positioned in such a way that the plurality of hot plates 5 and the lower plate 14 are interposed between the moving plate 33 and the fixed plate 32. Also, the guide bars 35, in which one end of each thereof is fixed to the base plate 10 and the other end is fixed to the cylinders 34a of the moving-plate operating cylinders 34, are coaxially mounted in each moving-plate operating cylinder 34. In the moving-plate operating cylinders 34, each guide hole 39, which axially passes through each rod 34b, is formed around each guide bar 35 such that the guide bar 35 can be slid through the guide hole 39, and each rod 34b is guided by the guide bars 35. Thus, each rod 34b and the moving plate 33 can be moved smoothly. Also, the locking section 37 having a plurality of grooves around the central axis is formed on the peripheral surface of the guide bars 35. The moving plate 33 has the pair of lock cylinder units 9 each having the locking member 38 in a freely movable manner in such a manner that they sandwich the guide bars 35. Accordingly, the pair of locking members 38 can be engaged with the locking sections 37 of the guide bars 35 by operating the lock cylinder units 9 according to predetermined conditions (turning-ON or the like of a cylinder switch disposed on the moving-plate operating cylinders 34). Accordingly, the relative movement of the moving plate 33 and the guide bars 35 is controlled and the moving plate 33 is mechanically retained. Thus, the center of the lower plate 14 is pressed by the ram 6a of the hot-plate pressing cylinder 6 in a state in which the moving plate 33 is retained.

The moving-plate retaining device in the hot pressing apparatus 31 according to the third embodiment conforms to the moving-plate retaining device in the first embodiment, wherein the structure is not limited to the structure in which the locking members 38 are engaged with the corresponding locking section 37 by operating the lock cylinder units 9.

The moving-plate operating device in the hot pressing apparatus 31 according to the third embodiment conforms to the moving-plate operating device in the first embodiment and is not limited to the cylinder unit.

In such an arrangement, the operation of the hot pressing apparatus 31 according to the third embodiment will be described. First, from the state shown in FIG. 5, in which the moving plate 33 is located at the lowermost end, the moving-plate operating cylinders 34 are operated to sequentially push up the plurality of hot plates 5 held on the set plate 13 toward the fixed plate 32 with the moving plate 33. In this instance, the moving-plate operating cylinders 34 can be smoothly operated by guiding each rod 34b by the guide bars 35, so that the moving plate 33 can be smoothly elevated (moved). As shown in FIG. 6, the lock cylinder units 9 are operated to engage the pair of locking members 38 with the locking sections 37 of the guide bars 35 in a state in which the materials 80 to be laminated between the hot plates 5 are pressed by the fixed plate 32 and the moving plate 33, and thus the moving plate 33 is locked to the guide bar 35 to be mechanically retained. Subsequently, in a state in which the moving plate 33 is firmly retained, the hot-plate pressing cylinder 6 is operated so that the ram 6a presses the center of the lower plate 14, and thus almost the entire surface of each material 80 to be laminated is pressed.

Thus, in the hot pressing apparatus 31 according to the third embodiment, the hot-plate pressing cylinder 6 is provided at the center of the moving plate 33, and the center of each material 80 to be laminated between the hot plates 5, which is pressed by the fixed plate 32 and the moving plate 33, is pressed by the hot-plate pressing cylinder 6, so that a uniform pressure can be applied to the materials 80 to be laminated between the hot plates 5, thereby preventing the occurrence of defects, such as wrinkles and bubbles, in the products (printed-circuit boards or the like).

Also, in the hot pressing apparatus 31 according to the third embodiment, the guide bars 35 are coaxially provided in each moving-plate operating cylinder 34; each rod 34b of each moving-plate operating cylinder 34 is provided with the guide hole 39 that axially passes therethrough; each guide hole 39 is provided around the guide bars 35 such that the guide bar 35 can be slid through the guide hole 39; and each rod 34b is guided by the guide bars 35. Consequently, each rod 34b can be moved smoothly so that the moving plate 33 can be smoothly elevated (moved). Also, the locking sections 37 are formed on the guide bars 35, and the lock cylinder units 9 each having the locking members 38 that can be engaged with the corresponding locking section 37 are mounted on the moving plate 33, wherein the locking members 38 are engaged with the locking section 37 by operating the lock cylinder units 9. Accordingly, the moving plate 33 is locked to the guide bars 35 to be mechanically retained when the materials 80 to be laminated between the hot plates 5 are pressed by the hot-plate pressing cylinder 6. As a result, the pressure from the hot-plate pressing cylinder 6 can be efficiently applied to the materials 80 to be laminated. Also, the reactive force against the pressure is not exerted to the moving-plate operating cylinders 34. Thus, the hydraulic cylinder as the moving-plate operating cylinders 34 results in capacity savings, in other words, it can be miniaturized, thereby decreasing the size of the entire hydraulic unit. Also, in the hot pressing apparatus 31 according to the third embodiment, since the guide bars 35 are disposed in the moving-plate operating cylinders 34, the structure can be simplified compared with the hot pressing apparatus 21 (refer to FIGS. 3 and 4) according to the second embodiment, in which the guide bars 25 are provided separately from the moving-plate operating cylinders 24. Also, since the guide bars 35 are coaxially mounted in the moving-plate operating cylinders 34, the moving plate 33 can be elevated more smoothly.

What is claimed is:

1. A hot pressing apparatus comprising:

a plurality of hot plates in a chamber;

a moving plate disposed below the hot plates;

a fixed plate disposed above the hot plates;

a moving-plate operating means disposed on the fixed plate, for moving the moving plate toward the fixed plate;

a moving plate-retaining means provided on the fixed plate, for retaining the moving plate; and a hot-plate pressing means comprising a ram and a ram cylinder, and provided at the center of the moving plate for pressing a substantially central part of each hot plate;

wherein the moving plate-operating means is provided with a plurality of shaft members for supporting a periphery of the moving plate, and materials to be laminated are disposed between the plurality of hot plates, and the moving plate is moved toward the fixed plate along the shaft members by the moving Plate-operating means, so that the materials to be laminated between the hot plates are hot pressed and integrally laminated.

2. A hot pressing apparatus according to claim 1, wherein the moving plate is guided by a plurality of guide bars disposed in the chamber.

3. A hot pressing apparatus comprising:

a plurality of hot plates in a chamber;

a moving plate disposed below the hot plates;

a fixed plate disposed above the hot plates;

a moving-plate operating means disposed on the fixed plate, for moving the moving plate toward the fixed plate;

a plurality of guide bars disposed in the chamber for guiding the moving plate;

a hot-plate pressing means comprising a ram and a ram cylinder, and provided at the center of the moving plate for pressing a substantially central part of each hot plate; and a moving-plate retaining means provided on the moving plate, for locking the guide bars and the moving plate to retain the moving plate in position;

wherein the moving plate-operating means is provided with a plurality of shaft members for supporting a periphery of the moving plate, and materials to be laminated are disposed between the plurality of hot plates and the moving plate is moved toward the fixed plate along the shaft members by the moving plate-operating means, so that the materials to be laminated between the hot plates are hot pressed and integrally laminated.

4. A hot pressing apparatus according to claim 3, wherein each shaft member is provided with a guide hole, such that each shaft member axially passes through each guide hole; and wherein the guide bars are coaxially mounted in each shaft member and are slid into each guide hole.

* * * * *